(12) United States Patent
Park

(10) Patent No.: US 7,830,712 B2
(45) Date of Patent: Nov. 9, 2010

(54) NON-VOLATILE MEMORY APPARATUS FOR CONTROLLING PAGE BUFFER AND CONTROLLING METHOD THEREOF

(75) Inventor: Kyoung-Wook Park, Ichon (KR)

(73) Assignee: Hynix Semiconductor Inc. (KR)

( * ) Notice: Subject to any disclaimer, the term of this patent is extended or adjusted under 35 U.S.C. 154(b) by 144 days.

(21) Appl. No.: 12/330,290

(22) Filed: Dec. 8, 2008

(65) Prior Publication Data

US 2009/0201735 A1    Aug. 13, 2009

(30) Foreign Application Priority Data

Feb. 12, 2008    (KR) ...................... 10-2008-0012499

(51) Int. Cl.
*G11C 16/00* (2006.01)
(52) U.S. Cl. .............................. 365/185.12; 365/189.05
(58) Field of Classification Search ............. 365/233.18
See application file for complete search history.

(56) References Cited

U.S. PATENT DOCUMENTS

| | | | |
|---|---|---|---|
| 7,130,222 B1 * | 10/2006 | Ho et al. ................. | 365/185.22 |
| 7,254,076 B2 * | 8/2007 | Chae et al. ................. | 365/207 |
| 2008/0250195 A1 | 10/2008 | Chow et al. | |

FOREIGN PATENT DOCUMENTS

| JP | 2007080415 | 3/2007 |
|---|---|---|
| KR | 1020030014255 A | 2/2003 |

* cited by examiner

*Primary Examiner*—Tan T. Nguyen
(74) *Attorney, Agent, or Firm*—Baker & McKenzie LLP

(57) ABSTRACT

A non-volatile memory apparatus for controlling a page buffer includes a page buffer configured to include a plurality of buffer stages, each buffering input/output data of cell arrays in units of predetermined number of bits, and a control unit configured to selectively activate one of the plurality of buffer stages when a burst mode as a synchronous mode is activated.

30 Claims, 5 Drawing Sheets

NON-VOLATILE MEMORY APPARATUS FOR CONTROLLING PAGE BUFFER AND CONTROLLING METHOD THEREOF

CROSS-REFERENCES TO RELATED APPLICATION

The present application claims priority under 35 U.S.C. §119(a) to Korean application number 10-2008-0012499, filed on Feb. 12, 2008 in the Korean Intellectual Property Office, which is incorporated by reference in its entirety as if set forth in full.

BACKGROUND

1. Technical Field

The embodiments described herein relate to a non-volatile memory device, and more particularly, to a non-volatile memory apparatus for controlling a page buffer and a method for controlling a page buffer of a non-volatile memory apparatus.

2. Related Art

Generally, a non-volatile memory (NVM) apparatus, such as a flash memory and a phase change random access memory (PRAM), programs and reads mass data in relatively short time periods. The non-volatile memory apparatus includes page buffers in order to temporarily store predetermined amounts of data and perform read/write operations. For example, the non-volatile memory apparatus includes pages that are composed in units of a predetermined number of cell arrays, wherein the page buffers are equipped in correspondence with these pages. Accordingly, when performing a page mode for a non-volatile memory device, the data of the corresponding page buffer that is selected by external input addresses are input/output during the read/write operations.

Presently, page architecture includes units of predetermined numbers of bits, for example, in units of 8 words. However, if a continuous mode is performed in order to broaden a data bandwidth, it is possible to access a corresponding page buffer twice, thereby resulting in the input/output of data of 16 words. However, since the page mode is an asynchronous operation that is externally performed by the column addresses input once, it should be controlled asynchronously even when the continuous mode is performed. Thus, unless sufficient time is secured, data collision may occur. Conversely, if sufficient time is assured in order to prevent data collision during the two accessing operations, data access time may increase.

SUMMARY

A non-volatile memory apparatus capable of synchronously controlling a page buffer and a method for controlling a page buffer of a non-volatile memory apparatus are described herein.

In one aspect, a non-volatile memory apparatus for controlling a page buffer includes a page buffer configured to include a plurality of buffer stages, each buffering input/output data of cell arrays in units of predetermined number of bits, and a control unit configured to selectively activate one of the plurality of buffer stages when a burst mode as a synchronous mode is activated.

In another aspect, a non-volatile memory apparatus for controlling a page buffer includes a memory block configured to include a plurality of sub-blocks, each corresponding to substantially the same column addresses and corresponding to first input/output data having a first bandwidth, and a page buffer block configured to include a plurality of buffer stages buffering the first input/output data of the sub-blocks to selectively activate one of the plurality of buffer stages to provide second input/output data having a second bandwidth, wherein the second bandwidth is greater than the first bandwidth.

In another aspect, a method for controlling a page buffer of a non-volatile memory apparatus includes buffering first input/output data of the non-volatile memory apparatus having a first input/output data bandwidth to produce second input/output data having a second input/output data bandwith, wherein the second bandwidth is greater than the first bandwidth.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
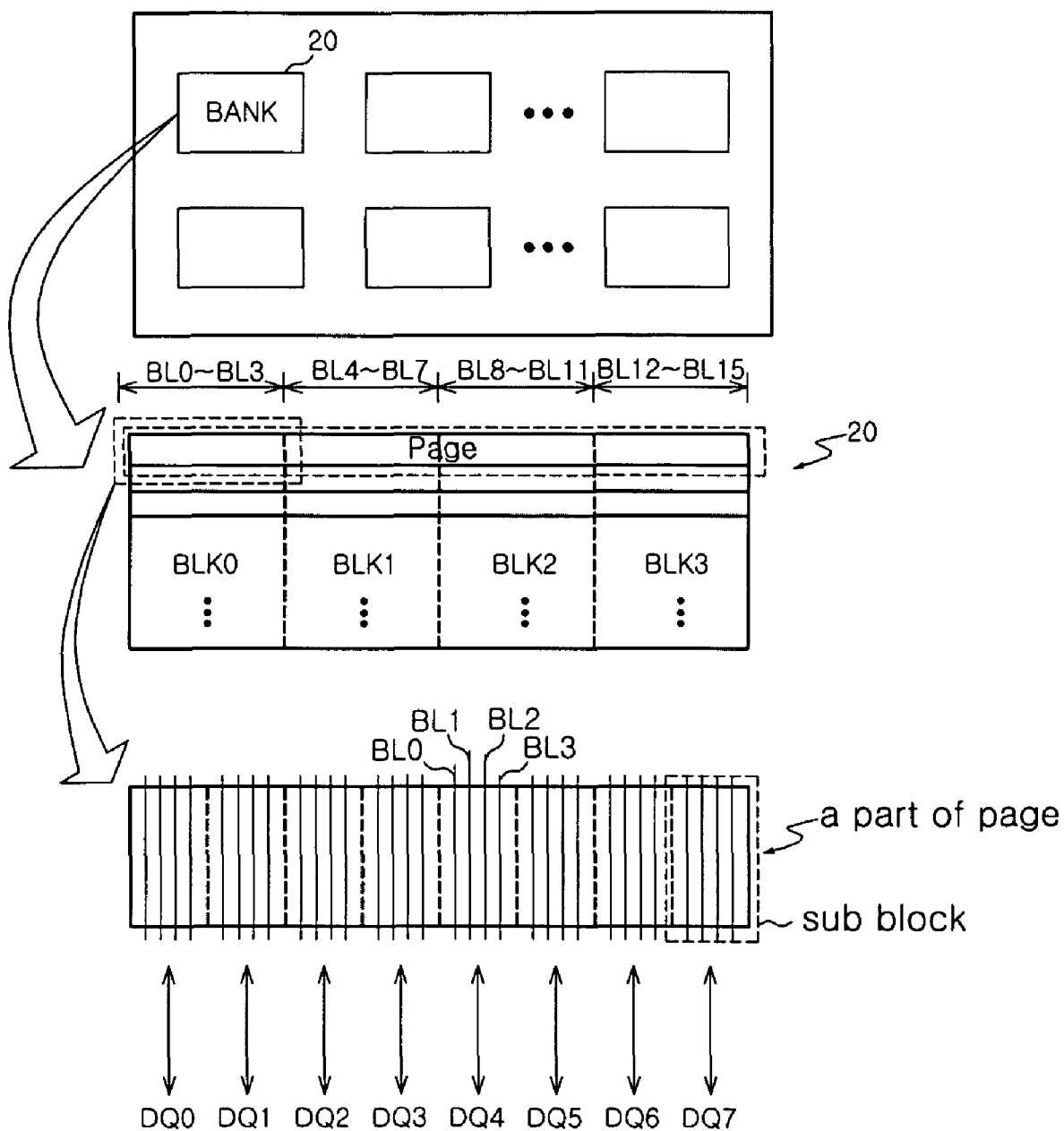
FIG. 1 is a schematic block diagram of an exemplary hierarchical structure of bank according to one embodiment.

FIG. 1 is a schematic block diagram of an exemplary hierarchical structure of bank according to one embodiment. Referring to FIG. 1, a non-volatile memory apparatus 1 can include a plurality of banks 20, wherein each bank can include cell arrays composed of a number of memory cells, and can be configured hierarchically. For example, each bank 20 can be divided into individual units of predetermined numbers of memory blocks including: a first memory block BLK0 can have first to fourth bit lines BL0 to BL3; a second memory block BLK1 can have fifth to eighth bit lines BL4 to BL7; a third memory block BLK2 can have ninth to twelfth bit lines BL8 to BL11; and a fourth memory block BLK3 can have thirteenth to sixteenth bit lines BL12 to BL15. Alternatively, other numbers of bit lines and/or sequential arrangements can be provided. In addition, each of the memory blocks BLK0 to BLK3 can be grouped on the basis of sharing word lines, thereby comprising a page. Accordingly, each page can be configured to include a plurality of the memory blocks BLK0 to BLK3 that each shares a word line. Thus, the non-volatile memory apparatus 1 can perform read/write operations in units of pages, and can be erased in units of memory blocks BLK0 to BLK3.

Moreover, each of the memory blocks BLK0 to BLK3 in a page can be arranged to include a plurality of sub-blocks, each corresponding to input/output pins DQ0 to DQ7. Accordingly, the same bit line groups, i.e., the first to third bit lines BL0 to BL3, can be arranged in a plurality of sub-blocks of the same order. Although 8 input/output pins DQ0 to DQ7 are shown in FIG. 1, other groupings of input/output pins may be used. Although not shown, since the page buffers can be equipped corresponding to the sub-blocks of each page, it is possible to read the data stored in units of sub-blocks wherein the cells correspond to the selected word lines, and store the read data in page buffers (not shown).

When data is input/output through a page grouped by the first to fourth memory blocks BLK0 to BLK3 that are connected to the same word lines and arranged at different bit lines, the data bandwidth may be 8 words. For example, the data bandwidth can be defined as a product of the number of input/output data per memory block and the total number of memory blocks, as can be presented as:

Data bandwidth=(# input/output data per memory block)×(total # of blocks)

wherein the number of input/output data per memory block is a product of the number of bit lines and the number of sub-blocks (or the number of input/output pins).

Since 1 word can comprise 2 bytes, in general, when the same word lines are activated, the data bandwidth of input/output data is 8 words according to the above numerical formula. For example, (4×8)×4=128 bits.

However, when performing a page mode, the data bandwidth of input/output data can be changed from 8 words to 16 words according to input/output control modes. In order to accommodate this situation, a scheme that continuously stores and outputs data in page buffers a second time is required. Thus, when in asynchronous page mode, since the control method is also asynchronous, an additional storage/output sequence may be required to prevent data collision or to secure a sufficient transmission time period. However, when in a change mode of data bandwidth, it is possible to control synchronously by way of controlling spare page buffer stages using a burst mode signal.

Figure 2:
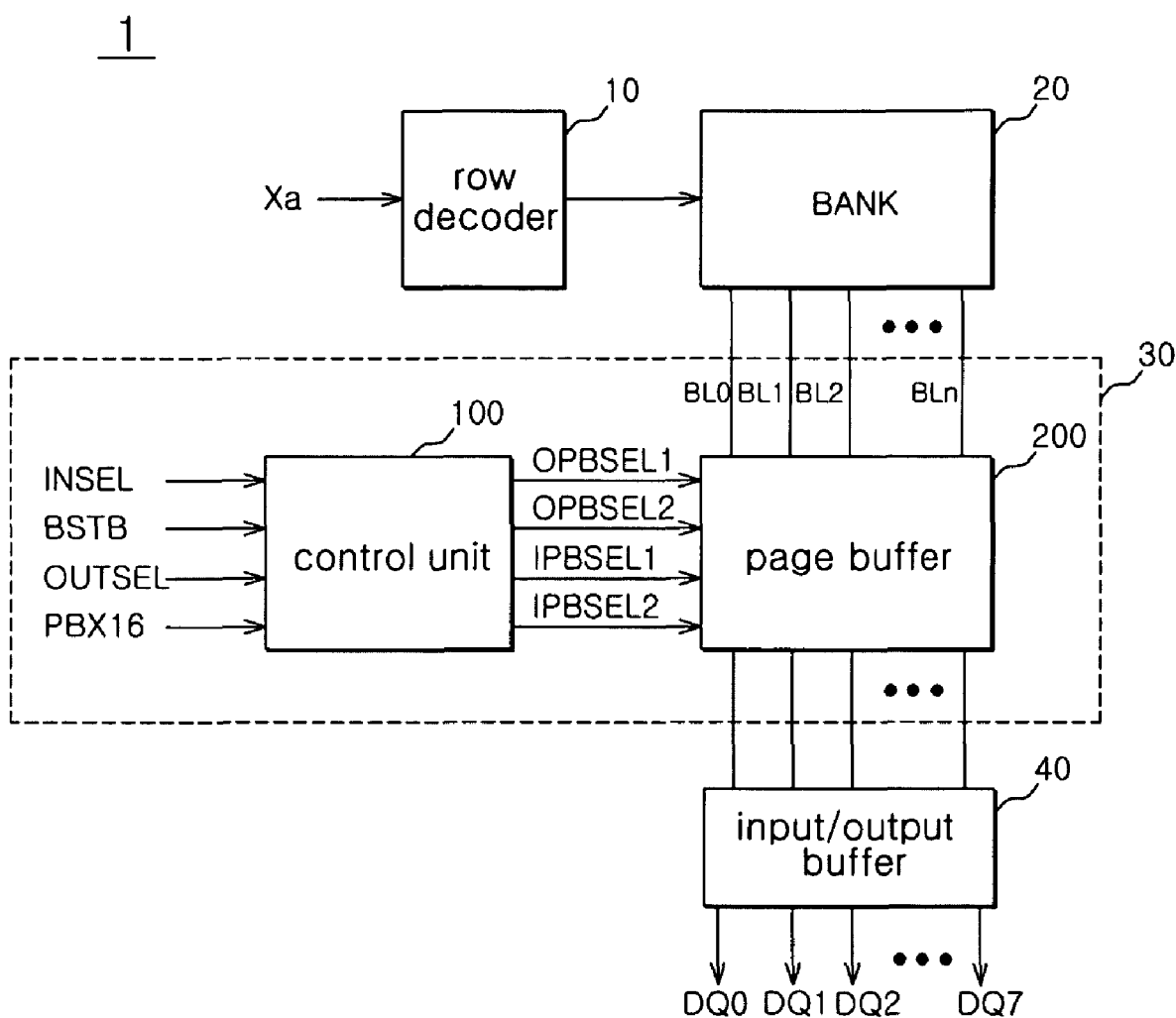
FIG. 2 is a schematic block diagram of an exemplary non-volatile memory apparatus that can be included in the bank of FIG. 1 according to one embodiment.

FIG. 2 is a schematic block diagram of an exemplary non-volatile memory apparatus of FIG. 1 according to one embodiment.

Referring to FIG. 2, a non-volatile memory apparatus 1 can be configured to include a row decoder 10, a bank 20, a page buffer block 30, and an input/output buffer 40. The row decoder 10 can decode row addresses Xa to select a specific memory block in bank 20.

The bank 20 can be arranged to include a plurality of pages (not shown) in a plurality of memory blocks. Each page can include a plurality of bit lines corresponding to the same column addresses, i.e., BL0 to BLn, and each bit line can be arranged in each of multiple sub-blocks to be connected to input/output pins different from one another. Although not shown, the cells of bank 20 can include a plurality of phase change memory cells, each including variable resistance apparatus that can include a phase change material or materials having two resistance values different from each other depending on one of a crystalline state or an amorphous states of the phase change material(s), and access apparatus that can control penetration current flowing through the variable resistance apparatus.

According to one, data can be buffered synchronously in the page buffer block 30. Here, the page buffer block 30 can be arranged to include a control unit 100 and a page buffer 200.

The control unit 100 can selectively control page buffering operations of the page buffer 200 by way of judging whether a data bandwidth is 8 words or 16 words. The control unit 100 can receive a page buffer input activating signal 'INSEL', a burst mode activating signal 'BSTB', a page buffer output activating signal 'OUTSEL', a data bandwidth change mode signal 'PBX16' as inputs. Based upon the inputs, the control unit 100 can provide first and second input selecting signals 'IPBSEL1' and 'IPBSEL2', and first and second output selecting signals 'OPBSEL1' and 'OPBSEL2' as outputs. The page buffer input activating signal 'INSEL' can be activated in order to store data from the bank 20 at the page buffer 200.

Due to the burst mode activating signal 'BSTB', an automatic count can be performed according to column addresses input on a basis of clock signals until the count reaches a predetermined number of times, and sequentially control the output data. When a burst mode is activated, an internal counter (not shown) can count until a predetermined number of times is reached. For example, when in an asynchronous page mode, the input/output data of selected page buffers can be controlled for restricting the input column addresses. Conversely, when in a synchronous burst mode, sequential selection of page buffers may be performed according to input column addresses and control of the input/output of the page buffers may be performed. The page buffer output activating signal 'OUTSEL' can be activated while the internal counter is counting, and can control data output from the page buffers.

For example, when the page buffer input activating signal 'INSEL' is activated to count a predetermined number of bits in response to a read or write command, the control unit 100 can selectively activate a plurality of the buffer stages (not shown) provided within the page buffer 200 depending on the level of the page buffer input activating signal 'INSEL'. In addition, the control unit 100 can control data transmission of the activated buffer stages according to the level of page buffer output activating signal 'OUTSEL'. Since the control unit 100 uses signals generated on the basis of clock signals, a synchronous control procedure can be performed, as described below.

The page buffer 200 can include a plurality of sub-page buffers (not shown), wherein each sub-page buffer can include first and second buffer stages (not shown). Accordingly, the page buffer 200 can output data stored in selected buffer stages (not shown) of respective sub-page buffers through input/output pins DQ0 to DQ7 in response to the first and second input selection signals 'IPBSEL1' and 'IPBSEL2' and the first and second output selection signals 'OPBSEL1' and 'OPBSEL2'. In addition, the input/output buffer 40 can buffer data supplied from the page buffer 200 to output the date through the input/output pins DQ0 to DQ7.

Figure 3:
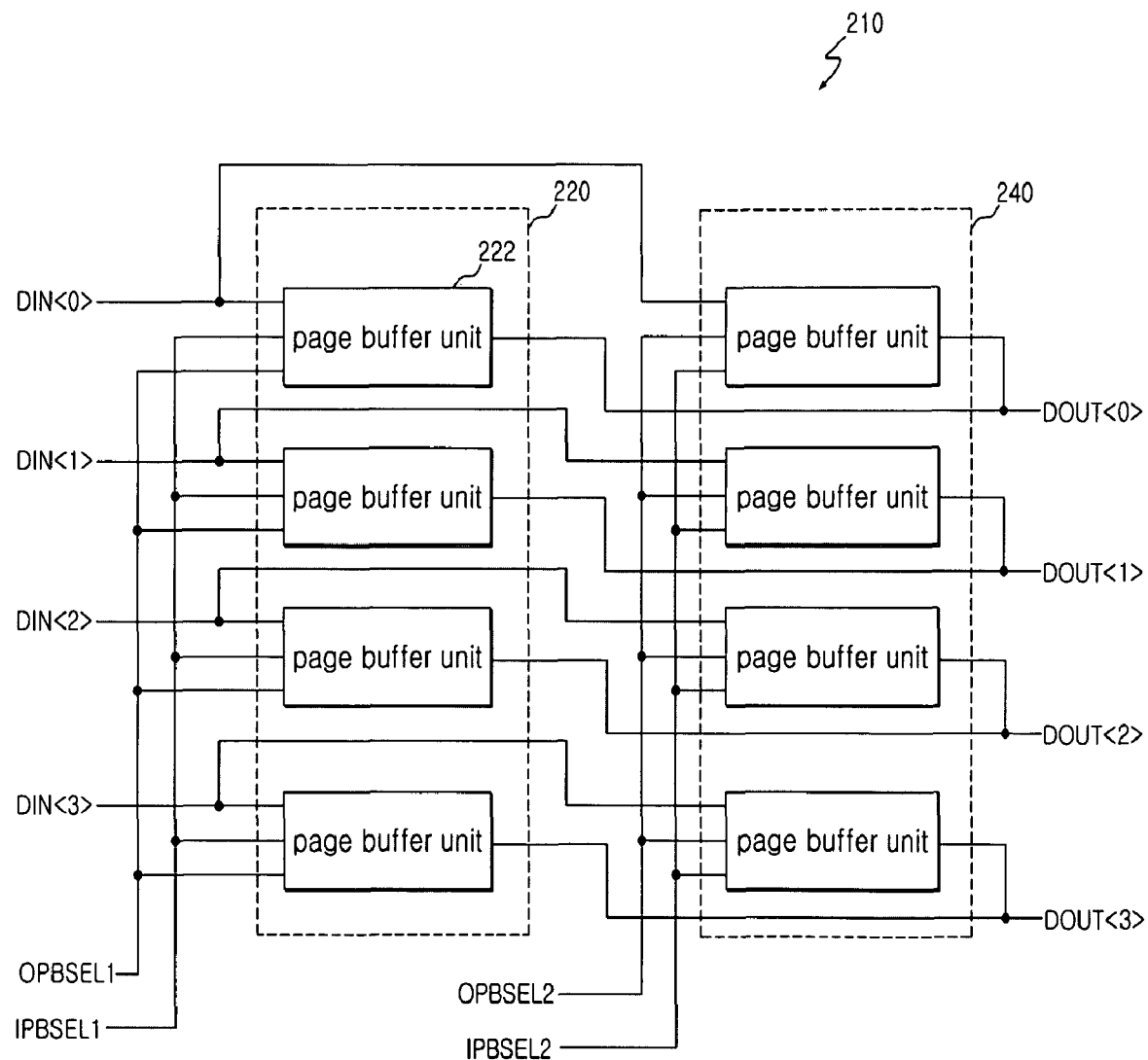
FIG. 3 is a schematic block diagram of an exemplary sub-page buffer that can be included in the non-volatile memory of FIG. 2 according to one embodiment.

FIG. 3 is a schematic block diagram of an exemplary sub-page buffer of FIG. 2 according to one embodiment. For the sake of brevity, an exemplary sub-page buffer 210 that corresponds to a sub-block including first to fourth bit lines BL0 to BL3 will be described. However, the page buffer 200 can include a plurality of sub-page buffers similar to the one described herein below. As an example, the number of page buffer units can be 8, but can be more or less than 8.

Referring to FIG. 3, the sub-page buffer 210 can be configured to include a first buffer stage 220 and a second buffer stage 240. Although the sub-page buffer 210 can be activated when in one of a read operation and a write operation, the one exemplary embodiment will be mainly described with respect to a read operation. Accordingly, use of the terms "input" and "output" are relative based upon not only the read operation or the write operation, but upon how the individual signals are presented and processed.

The first buffer stage 220 can include a plurality of page buffer units 222 to which input data DIN<0:3> transmitted from the first to fourth bit lines BL0 to BL3 can be applied, respectively, wherein the first buffer stage 220 can buffer data that is read by a read command. Here, the first buffer stage 220 can operate in response to the first input selection signal 'IPBSEL1' and the first output selection signal 'OPBSEL1'.

The second buffer stage 240 can include a plurality of page buffer units 222 to which input data DIN<0:3> transmitted from the first to fourth bit lines BL0 to BL3 can be applied, respectively, wherein the second buffer stage 240 can buffer input data DIN<0:3> in response to a second read command. Here, the second buffer stage 240 can operate in response to second input selection signal 'IPBSEL2' and a second output selection signal 'OPBSEL2'.

Accordingly, input data DIN<0:3> from the same group can be applied to the first buffer stage 220 and the second buffer stage 240 at the same time. However, since the signals that control buffering of the data are selectively activated, the first and second buffer stages 220 and 240 do not necessarily buffer data at the same time.

The buffering operation can be performed based upon control signals generated on the basis of clock signals and relationships between the clock signals. For example, the input data DIN<0:3> can be buffered and output by the first buffer stage 220 in response to the first input selection signal 'IPBSEL1' and the first output selection signal 'OPBSEL1'. Then, if the first input selection signal 'IPBSEL1' and the first output selection signal 'OPBSEL1' are both inactivated, and if the second input selection signal 'IPBSEL2' and the second output selection signal 'OPBSEL2' are both activated, then the input data DIN<0:3> can be buffered and output by the second buffer stage 240. As a result, since data has already been read twice by way of one sub-page buffer to output the same data twice through a limited number of input/output pins, twice the data bandwidth can be achieved.

Figure 4:
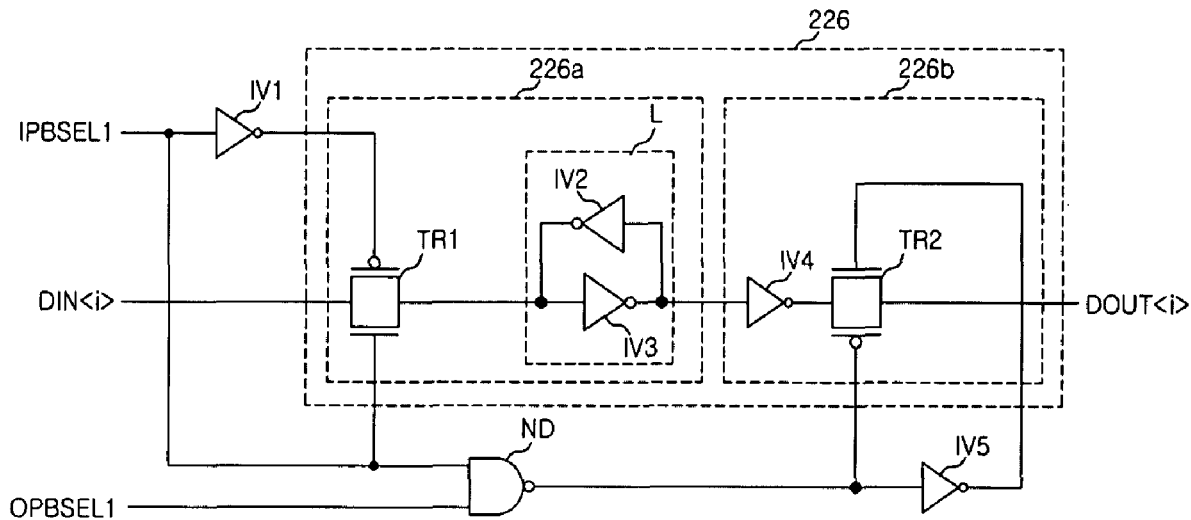
FIG. 4 is a schematic circuit diagram of an exemplary page buffer unit that can be included in the sub-page buffer of FIG. 3 according to one embodiment.

FIG. 4 is a schematic circuit diagram of an exemplary page buffer unit of FIG. 3 according to one embodiment. As shown in FIG. 3, the page buffer unit 222 can be included in both the first and second buffer stages 220 and 240. Moreover, the configuration of the page buffer units 222 provided in both buffer stages can be substantially identical, except that signals received by each of the page buffer units 222 can be different from one another. For the sake of brevity and to avoid repeated descriptions, only one exemplary circuit diagram of the page buffer units 222 included in the first and second buffer stages 220 and 240 be described in detail.

Referring to FIG. 4, the page buffer unit 222 can provide input data DIN<i> as output data DOUT<i> in response to the first input selection signal 'IPBSEL1' and the first output selection signal 'OPBSEL1'. The page buffer unit 222 can include a data transmission unit 226 that can be configured to include a first transmission unit 226a and a second transmission unit 226b.

The first transmission unit 226a can include a first pass gate TR1 and a latch unit L, wherein the latch unit L can include second and third inverters IV2 and IV3 connected in a latch-type configuration. The first pass gate TR1 can be turned ON in response to the activated input selection signal 'IPBSEL1'.

The second transmission unit 226b can be activated in response to the first input selection signal 'IPBSEL1' and the first output selection signal 'OPBSEL1', and can include a fourth inverter INV4 and a second pass gate TR2. The second pass gate TR2 can be turned ON in response to the activated first input selection signal 'IPBSEL1' and the activated first output selection signal 'OPBSEL1'.

The operation of the page buffer unit 222 will now be described. When the first input selection signal 'IPBSEL1' is activated at a high level is received and provided as an input, the first pass gate TR1 can be turned ON so as to transmit the input data DIN<i>. Here, if the first output selection signal 'OPBSEL1' is activated, then the second pass gate TR2 can be turned ON as well. Thus, the input data DIN<i> can be transmitted, and be supplied as the output data DOUT<i>.

Next, operation of the page buffer unit 222 will be described where the inactivated first input selection signal 'IPBSEL1' and the inactivated first output selection signal 'OPBSEL1' are received by the page buffer unit 222. Here, operation of the buffer stage, i.e., either the first or second buffer stage 220 or 240, including the corresponding page buffer unit 222 is inactivated. Accordingly, the first pass gate TR1 for receiving the first input selection signal 'IPBSEL1' at a low level can be turned OFF. Since the first output selection signal 'OPBSEL1' can also be inactivated at a low level, the second pass gate TR2 can be turned OFF. Thus, the latch unit L can latch the previously input data DIN<i>.

In this way, the page buffer unit 222 can output the input data DIN<i> in response to the activated first input selection signal 'IPBSEL1' and the activated first output selection signal 'OPBSEL1'. In addition, the page buffer unit 222 can float output data DOUT<i> when receiving the inactivated first input selection signal 'IPBSEL1' and the inactivated first output selection signal 'OPBSEL1' as input.

Figure 5:
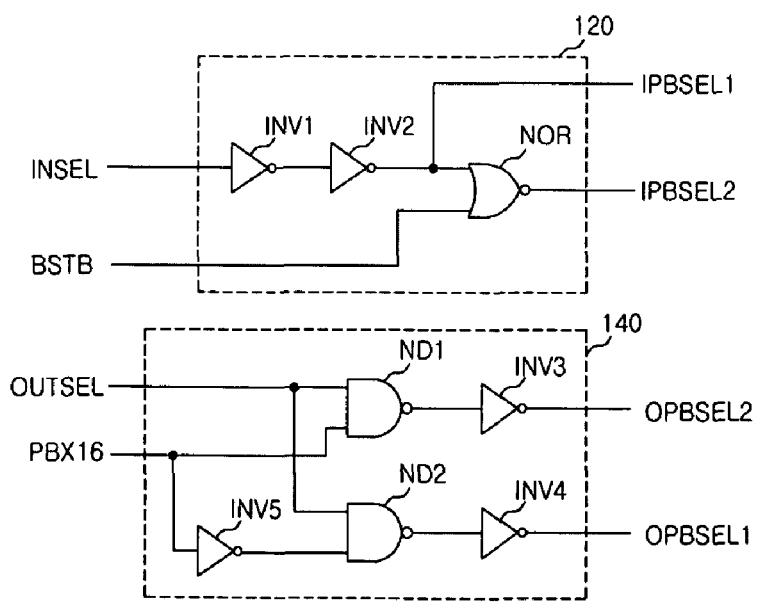
FIG. 5 is a schematic circuit diagram of an exemplary control unit that can be included in the non-volatile memory of FIG. 2 according to one embodiment.

FIG. 5 is a schematic circuit diagram of an exemplary control unit of FIG. 2 according to one embodiment. Referring FIG. 5, the control unit 100 can be configured to include an input control unit 120 and an output control unit 140.

The input control unit 120 can generate the first and second input selection signals 'IPBSEL1' and 'IPBSEL2' in response to the page buffer input activating signal 'INSEL' and the burst mode activating signal 'BSTB'. The input control unit 120 can include first and second inverters INV1 and INV2, and a NOR gate NOR. Here, the page buffer input activating signal 'INSEL' can be an input control signal for the first buffer stage (220 in FIG. 3). Accordingly, the first input selection signal 'IPBSEL1' can be output, thereby maintaining the level of the page buffer input activating signal 'INSEL' through the first and second inverters INV1 and INV2. Thus, when the page buffer input activating signal 'INSEL' is activated at a high level and received as an input, the activated first input selection signal 'IPBSEL1' can be generated. Regardless of whether in an asynchronous mode or a synchronous mode, since buffering operation begins as the first buffer stage is activated, the activated first input selection signal 'IPBSEL1' can be generated. Principles for generating the page buffer input activating signal 'INSEL' will be described below.

The level of the second input selection signal 'IPBSEL2' can be determined according to levels of the burst mode activating signal 'BSTB' and the first input selection signal 'IPBSEL1'. For example, in a synchronous mode, the second input selection signal 'IPBSE2' can be generated at an activated high level, according to the NOR operation of the activated burst mode signal 'BSTB' at a low level and the inactivated input selection signal 'IPBSEL1' at a low level. Here, when the activated burst mode signal 'BSTB' at a low level is received and the input selection signal 'IPBSEL1' is inactivated, the activated second input selection signal 'IPBSEL2' at a high level can be generated. Thus, after a synchronous mode is determined and data is input to the first buffer stage (220 in FIG. 3), data can be stored in the second buffer stage (240 in FIG. 3). Meanwhile, the output control unit 140 can generates the first and second output selection signals 'OPBSEL1' and 'OPBSEL2' in response to the page buffer output activating signal 'OUTSEL' and the data bandwidth change mode signal 'PBX16'.

The output control unit 140 can be configured to include first and second NAND gates ND1 and ND2, and third to fifth inverters INV3 to INV5. As detailed above, the page buffer input activating signal 'INSEL' and the page buffer output activating signal 'OUTSEL' can activate a counter that counts the predetermined number of times in response to column addresses capable of selecting page buffers. In general, the column address can be input together with read or write commands. Thus, the page buffer input activating signal 'INSEL' and the page buffer output activating signal 'OUTSEL' can control sequential activation of the page buffers in response to read or write commands. Meanwhile, since the page buffer can output data after they store the data, the page buffer output activating signal 'OUTSEL' can be activated as a delayed signal after a time period when the page buffer input activating signal 'INSEL' is activated.

By way of example, the page buffer output activating signal 'OUTSEL' can activate a counter, which receives 3 bits of external column address input signals to count the number of 8 bits. Although is the example for counting is for a number of 8 bits in order to be correspondent to the number of input/output pins, the structure of the counter may be changed as the number of input/output pins is changed.

As detailed above, data bandwidth can be determined according to the level of the data bandwidth change mode signal 'PBX16'. For example, the data bandwidth change mode signal 'PBX16' at a high level can control output of a data bandwidth of 16 words, and the data bandwidth change mode signal 'PBX16' at a low level can control output of a data bandwidth of 8 words. The data bandwidth change mode signal 'PBX16' can be exemplified as a signal generated by a carry signal, which is provided when the internal counter reaches the predetermined number of times in a burst mode. Thus, although the data bandwidth change mode signal 'PBX16' can be activated in response to read or write commands, the data bandwidth change mode signal 'PBX16' can be activated after a predetermined time, i.e., a time when the counter counts the predetermined number of times. For example, during the time period when the first buffer stages (220 in FIG. 3) of the respective sub-blocks (corresponding to the input/out pins DQ0 to DQ 7 in FIG. 2) are sequentially activated, the data bandwidth change mode signal 'PBX16' can be inactivated.

With respect to the operation of the output control unit 140, the output control unit 140 can generate the first output selection signal 'OPBSEL1' in response to the page buffer output activating signal 'OUTSEL' and the inverted data bandwidth change mode signal 'PBX16'. Accordingly, when the second NAND gate ND2 receives the activated page buffer output activating signal 'OUTSEL' at a high level and the inverted level of the inactivated data bandwidth change mode signal 'PBX16' as input, the second NAND gate ND2 can provide a signal at a low level as an output. Thus, the first output selection signal 'OPBSEL1' can be activated to a high level by an inverting operation of the fourth inverter INV4. Here, the page buffer output activating signal 'OUTSEL' can be activated according to a first read command (or write command), and although the data bandwidth change mode signal 'PBX16' can respond to a read command (or write command), the page buffer output activating signal 'OUTSEL' can be supplied at an inactivated level before the counter counts the predetermined number of times. Then, when the data bandwidth change mode signal 'PBX16' is activated, the first output selection signal 'OPBSEL1' can be inactivated by a NAND operation. For example, during a time interval when the data bandwidth change mode signal 'PBX16' is inactivated, the first output selection signal 'OPBSEL1' can be activated in order to make the output of the first buffer stage (220 in FIG. 3) effective. However, when the counter counts the predetermined number of times so that the data bandwidth change mode signal 'PBX16' is activated, the first output selection signal 'OPBSEL1' can be inactivated in order to block off the output of the first buffer stage (220 in FIG. 3). Meanwhile, since the second output selection signal 'OPBSEL2' can be substantially identical to the first output selection signal 'OPBSEL1', except for receiving the inverted or non-inverted level of the data bandwidth change mode signal 'PBX16', the second output selection signal 'OPBSEL2' can have an inverted level of the first output selection signal 'OPBSEL1'. For example, the level of the second output selection signal 'OPBSEL2' can be substantially opposite to the level of the first output selection signal 'OPBSEL1'. Accordingly, if the page buffer output activating signal 'OUTSEL' is activated, then either the first output selection signal 'OPBSEL1' or the second output selection signal 'OPBSEL2' can be selectively activated depending on the level of the data bandwidth change mode signal 'PBX16'.

Figure 6:
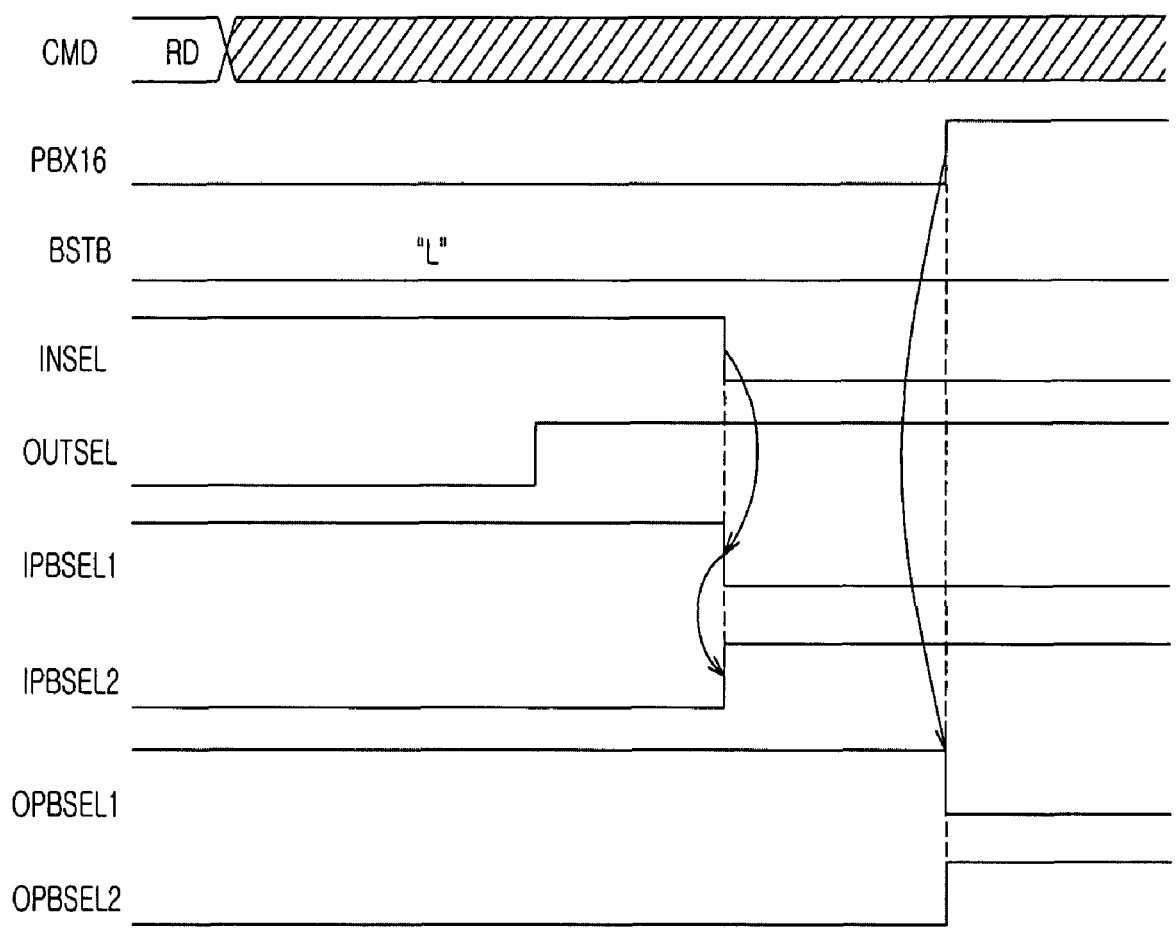
FIG. 6 is a timing diagram of exemplary operation characteristics of a control unit that can be included in the bank of FIG. 1 according to one embodiment.

FIG. 6 is a timing diagram of exemplary operation characteristics of a control unit of FIG. 1 according to one embodiment. Referring to FIG. 6, as well as FIGS. 1-5, when the burst mode is activated, the page buffer input activating signal 'INSEL' can be activated according to a read command, until the input data DIN<0:3> is input at the first buffer stage 220. The first input selection signal 'IPBSEL1' can be activated in response to the page buffer input activating signal 'INSEL'.

Meanwhile, the page buffer output activating signal 'OUTSEL' can be activated in response to column addresses that are input when a read command is activated, and can maintain an activated state while the internal counter is activated by an activated burst mode signal 'BSTB'. As detailed above, the page buffer output activating signal 'OUTSEL' can control sequential activation of a plurality of sub-page buffers.

The page buffer input activating signal 'INSEL' can latch a high level as a first level for a predetermined time. Then, the page buffer input activating signal 'INSEL' can be inverted to a low level as a second level. For example, after counting the predetermined number of bits, the page buffer input activating signal 'INSEL' can be toggled and inverted to a low level. Thus, when the first input selection signal 'IPBSEL1' is activated, the first buffer stage 220 can be activated to buffer the input data. The buffered data can be output during a time period when the first output selection signal 'OPBSEL1' is activated. Meanwhile, when the first input selection signal 'IPBSEL1' is inactivated and the second input selection signal 'IPBSEL2' is activated, the second buffer stage 240 can buffer the input data. Output of the buffered data can be controlled by means the activated second output selection signal 'OPBSEL2'. Accordingly, by buffering the input data using first and second buffer stages and synchronously controlling that the reading of the data from the first and second buffer stages, data bandwidth can be increased by a factor of 2.

According to the one embodiment, it is possible to control page buffers synchronously when performing a continuous mode using the burst mode signal as synchronous control signal. For example, since a plurality of the buffer stages are provided and the buffer stages are selectively activated to control input/output of the same data twice by a synchronous control signal, data collision can be avoided. In addition, since synchronous control can be performed, data can be input/output without a significant time gap.

While certain embodiments have been described above, it will be understood that the embodiments described are by way of example only. Accordingly, the apparatus and method described herein should not be limited based on the described embodiments. Rather, the apparatus and methods described herein should only be limited in light of the claims that follow when taken in conjunction with the above description and accompanying drawings.

What is claimed is:

1. A non-volatile memory apparatus for controlling a page buffer, comprising:
   a page buffer configured to include a plurality of buffer stages, each buffering input/output data of cell arrays in units of predetermined number of bits; and
   a control unit configured to selectively activate one of the plurality of buffer stages when a burst mode as a synchronous mode is activated.

2. The non-volatile memory apparatus of claim 1, wherein the control unit includes:
   an input control unit configured to receive a burst mode activating signal and a page buffer input activating signal for controlling input of the input/output data to generate first and second input selection signals; and
   an output control unit configured to receive a data bandwidth change mode signal for controlling a bandwidth of the input/output data and to receive a page buffer output activating signal for controlling output of the input/output data to generate first and second output selection signals.

3. The non-volatile memory apparatus of claim 2, wherein the page buffer input activating signal controls counting of input column addresses for a predetermined number of times when one of a read command and a write command is input to the cell arrays.

4. The non-volatile memory apparatus of claim 2, wherein the input control unit provides the activated first input selection signal in response to the activated page buffer input activating signal.

5. The non-volatile memory apparatus of claim 2, wherein the input control unit generates the second input selection signal having an inverted level of the first input selection signal when the burst mode activating signal is activated.

6. The non-volatile memory apparatus of claim 5, wherein each of the plurality of buffer stages are selectively activated in response to the first input selection signal and the second input selection signal to selectively receive the input/output data of the cell arrays.

7. The non-volatile memory apparatus of claim 2, wherein the output control unit controls counting of input column addresses for the predetermined number of times in response to one of a read command and a write command.

8. The non-volatile memory apparatus of claim 7, wherein the page buffer output activating signal is activated to be delayed with respect to the page buffer input activating signal.

9. The non-volatile memory apparatus of claim 2, wherein the output control unit generates the first output selection signal having the level of the page buffer output activating signal and the second output selection signal having the inverted level thereof, according to the level of the data bandwidth change mode signal.

10. The non-volatile memory apparatus of claim 9, wherein each of the plurality of buffer stages are selectively activated in response to the first output selection signal and the second output selection signal to selectively output buffered data of the cell arrays.

11. The non-volatile memory apparatus of claim 2, wherein when the data bandwidth change mode signal is at a low level as a first level, a bandwidth mode of the input/output data is maintained as an original input/output state, and when the data bandwidth change mode signal is at a high level as a second level, a bandwidth mode of the input/output data is increased to twice the original input/output state.

12. The non-volatile memory apparatus of claim 1, wherein each of the plurality of buffer stages of the page buffer include a first buffer stage and a second buffer stage to which the input data is applied.

13. A non-volatile memory apparatus for controlling a page buffer, comprising:
   a memory block configured to include a plurality of sub-blocks, each corresponding to substantially the same column addresses and corresponding to first input/output data having a first bandwidth; and
   a page buffer block configured to include a plurality of buffer stages buffering the first input/output data of the sub-blocks to selectively activate one of the plurality of buffer stages to provide second input/output data having a second bandwidth,
   wherein the second bandwidth is greater than the first bandwidth.

14. The non-volatile memory apparatus of claim 13, wherein the page buffer block includes:
   a page buffer configured to include first and second buffer stages that buffer the first input/output data of the sub-block; and
   a control unit configured to selectively activate the first and second buffer stages responsively when a burst mode as a synchronous mode is activated.

15. The non-volatile memory apparatus of claim 14, wherein the control unit includes:
   an input control unit receiving a burst mode activating signal and a page buffer input activating signal to generate first and second input selection signals for controlling an input/output of the first input/output data; and
   an output control unit receiving a data bandwidth change mode signal for controlling the first bandwidth of the first input/output data and receiving a page buffer output activating signal to generate first and second output selection signals for controlling input/output of the first input/output data.

16. The non-volatile memory apparatus of claim 15, wherein the page buffer input activating signal controls counting of the input column addresses for a predetermined number of times when one of a read command and a write command is input to the cell arrays.

17. The non-volatile memory apparatus of claim 15, wherein the input control unit provides the activated first input selection signal in response to the activated page buffer input activating signal.

18. The non-volatile memory apparatus of claim 15, wherein the input control unit generates the second input selection signal having an inverted level of the first input selection signal when the burst mode activating signal is activated.

19. The non-volatile memory apparatus of claim 18, wherein the first buffer stage receives the first input/output data in response to the first input selection signal, and the second buffer stage receives the first input/output data in response to the second input selection signal.

20. The non-volatile memory apparatus of claim 15, wherein the output control unit controls counting of the input column addresses for the predetermined number of times in response to one of a read command and a write command.

21. The non-volatile memory apparatus of claim 20, wherein the page buffer output activating signal is activated to be delayed with respect to the page buffer input activating signal.

22. The non-volatile memory apparatus of claim 15, wherein the output control unit generates the first output selection signal having the level of the page buffer output activating signal and the second output selection signal having the inverted level thereof, according to the level of the data bandwidth change mode signal.

23. The non-volatile memory apparatus of claim 22, wherein the first buffer stage outputs the first input/output data in response to the first output selection signal, and the second buffer stage outputs the first input/output data in response to the second output selection signal.

24. The non-volatile memory apparatus of claim 15, wherein the data bandwidth change mode signal is at a low level as a first level, a bandwidth mode of the first input/output data is maintained at an original input/output state, and when the data bandwidth change mode signal is at a high level as a second level, a bandwidth mode of the first input/output data is increased to twice the original input/output state.

25. The non-volatile memory apparatus of claim 14, wherein each of the first and second buffer stages includes a plurality of page buffer units to which the first input/output data is applied.

26. The non-volatile memory apparatus of claim 25, wherein each of the plurality of page buffer units includes:
a pass gate configured to be turned ON in response to a signal that activates the page buffer unit; and
a latch unit configured to latch the first input/output data.

27. A method for controlling a page buffer of a non-volatile memory apparatus, comprising:
buffering first input/output data of the non-volatile memory apparatus having a first input/output data bandwidth to produce second input/output data having a second input/output data bandwith,
wherein the second bandwidth is greater than the first bandwidth.

28. The method of claim 27, further comprising generating a data bandwidth change mode signal for controlling the first input/output data bandwidth of the first input/output data.

29. The method of claim 28, wherein when the data bandwidth change mode signal is at a low level as a first level, a bandwidth mode of the first input/output data is maintained at the first input/output data bandwidth, and when the data bandwidth change mode signal is at a high level as a second level, a bandwidth mode of the first input/output data is increased to the second input/output data bandwidth.

30. The method of claim 27, wherein the second input/output bandwidth is twice the first input/output bandwidth.

* * * * *